United States Patent [19]

Wang

[11] Patent Number: 4,818,721
[45] Date of Patent: Apr. 4, 1989

[54] ION IMPLANTATION INTO IN-BASED GROUP III-V COMPOUND SEMICONDUCTORS

[75] Inventor: Kou-Wei Wang, Piscataway, N.J.

[73] Assignee: American Telephone and Telegraph Company, AT&T Bell Laboratories, Murray Hill, N.J.

[21] Appl. No.: 79,371

[22] Filed: Jul. 29, 1987

[51] Int. Cl.$^4$ .......................................... H01L 21/265
[52] U.S. Cl. ................................... 437/22; 357/65; 437/19; 437/24; 437/29; 437/247; 437/942
[58] Field of Search ............. 357/65; 437/22, 19, 437/24, 247, 29, 942

[56] References Cited

U.S. PATENT DOCUMENTS

| 4,385,938 | 5/1983 | Park et al. | 148/357 |
| 4,494,995 | 1/1985 | Tabatabaie-Acau et al. | 437/22 |
| 4,545,824 | 10/1985 | Salvi et al. | 437/22 |
| 4,555,273 | 11/1985 | Collins et al. | 437/22 |

FOREIGN PATENT DOCUMENTS 61-280616  12/1986  Japan ........................... 21/265

OTHER PUBLICATIONS

Rao et al, Jap. Jour. Appl. Phys., 25 (1986), pp. L-458.
Patel et al, Appl. Phys. Letts., 48 (1986), 1467.
Gauneau et al, Jour. Appl. Phys, 57 (1985), 1029.
J. P. Donnelly et al, Appl. Phys. Lett., vol. 31, pp. 418-420, (1977).
T. Inada et al, J. Appl. Phys., vol. 52, pp. 6623-6629, (1981).
J. D. Oberstar et al, J. Electrochem. Soc., vol. 129, p. 1312, (1982).
A. N. M. Masum Coudhury et al, Appl. Phys. Lett., vol. 43, pp. 381-383, (1983).
B. Molnar et al, Mat. Res. Soc. Symp. Proc., vol. 27, pp. 329-334, (1981).
J. P. Donnelly, Nucl. Inst. & Methods, vol. 182/183, pp. 553-571, (1981).
U. König et al, J. Elec. Mat., vol. 14, pp. 311-326, (1985).
D. E. Davies et al, Appl. Phys. Lett., vol. 44, No. 3, pp. 304-306, (1984).
S. S. Gill et al, J. Electrochem. Soc., Dec. 1986, pp. 2590-2596.
L. N. Kurbatov et al, Sov. Phys.-Dokl., vol. 28, No. 1, Jan. 1983, pp. 45-47.
H. M. Macksey et al, IEEE Electron Device Letters, vol. EDL-8-No. 3, Mar. 1987, pp. 116-117.
A. T. Yuen et al, Ion Beam Processes in Advanced Electronic Materials and Device Technology, pp. 285-290, 1985.

Primary Examiner—Upendra Roy
Attorney, Agent, or Firm—Michael J. Urbano

[57] ABSTRACT

Implantation of a Group V ion species (e.g., phosphorus or arsenic) into an In-based Group III-V compound semiconductor (e.g., InP, InGaAs) followed by implantation of Be ions produces a shallow p-type surface layer and avoids significant in-diffusion of the dopant species. High carrier concentrations and activation efficiencies are attained. The technique has application in the fabrication of FETs, APDs and ohmic contacts.

16 Claims, 2 Drawing Sheets

ION IMPLANTATION INTO IN-BASED GROUP III-V COMPOUND SEMICONDUCTORS

BACKGROUND OF THE INVENTION

This invention relates to ion implantation into In-based Group III-V compound semiconductors.

Ion implantation is a well-known technique for doping semiconductors and, in the case of silicon semiconductor devices, is characterized by excellent control of doping concentration and depth as well as precise registration of implanted zones with electrical contacts. It entails causing high energy ions to impinge on and penetrate into a surface of the semiconductor so as to form a shallow region in which the ions are incorporated. To render the ions electrically active, the semiconductor is typically subjected to a suitable heat treatment known as "activation".

In contrast with silicon devices, where ion implantation is a relatively mature technology, ion implantation into Group III-V compounds is still primarily in a developmental stage faced with special problems, many of which are not extant in the silicon art. For example, Group III-V compounds often exhibit nonstoichiometry as a result of evaporation of the more volatile Group V species (e.g., P in InP) during high temperature processing steps (e.g., activation). Nonstoichiometry also results from the disparate masses of the Group III and Group V species (115 for In and 31 for P) which, during ion implantation, cause the P atoms to be displaced deeper into the semiconductor than the In atoms. In either case, Group V vacancies (e.g., P vacancies) occur and present a unique problem because Group II dopant species (e.g., Be) which enter such vacancies are electrically inactive. As a consequence, the implanted region may contain many dopant atoms which do not contribute to the carrier concentration of the semiconductor.

As between GaAs and InP and their related materials system, interest in GaAs for high-speed integrated circuit applications is widespread, but considerable attention is also being given to In-based Group III-V compound electronic devices (e.g., InP FETs) because of their ability to be integrated with optical devices (e.g., InP/InGaAsP lasers, InP/InGaAs photodiodes) made from similar materials, especially those suitable for use in long wavelength fiber optic applications. In addition, InP has higher peak electron drift velocity and higher breakdown field than GaAs, which portends higher performance of electronic devices such as FETs.

Thus, if ion implantation into InP and other In-based Group III-V compounds can be mastered, it promises to have significant device implications. The following publications attest, however, to the hurdles workers have faced and failed to surmount in their attempts to realize a practical ion-implantation process in InP:

1. J. P. Donnelly et al, *Appl. Phys. Lett.*, Vol. 31, p. 418 (1977).
2. T. Inada et al, *J. Appl. Phys.*, Vol. 52, p. 6623 (1981).
3. K. V. Vaidyanathan et al, *Nucl. Instru. and Methods*, Vol. 182/183, p. 631 (1981).
4. J. D. Oberstar et al, *J. Electrochem. Soc.*, Vol. 129, p. 1312 (1982).
5. A. N. M. Masum Choudhury et al, *Appl. Phys. Lett.*, Vol. 43, p. 381 (1983).
6. B. Molnar et al, *Mat. Res. Soc. Symp. Proc.*, Vol. 27, p. 329 (1984).
7. J. P. Donnelly, *Nucl. Instru. and Methods*, Vol. 182/183, p. 553 (1981).
8. U. König et al, *J. Elec. Mat.*, Vol. 14, p. 311 (1985).

These studies have shown that a peak carrier concentration of about $10^{19}/cm^3$ is achievable with n-type implants, but for p-type implants the electrical activation is usually less than 50% in the $10^{17}/cm^3$ range, but is only about 15% at the maximum achievable hole concentration of about $10^{18}/cm^3$. In addition, broadening of the implant profile (Inada et al) as well as in-diffusion of p-type dopant was observed after an elevated temperature activation process (Oberstar et al and König et al). The lower electrical carrier concentration as well as the in-diffusion makes control of the p-type implant difficult and realization of a shallow p+-layer a challenge. Such a p+-layer could be used to form an abrupt p-n junction of a field effect transistor, a main junction of an avalanche photodiode, or a low contact resistance layer of a laser diode.

Looking deeper at the problems of forming a shallow ion-implanted p+-layer in InP, the first four references above relate to ion implantation of Be, Mg, Zn or Cd ions, typical p-type dopants, into Fe-doped, semi-insulating InP substrates, and report the following: (1) p+-implants using Mg, Zn or Cd resulted in a dead surface layer without free electrical carriers after activation; (2) elevated temperature activation of BE and Zn implants caused in-diffusion of the dopants; (3) the peak carrier concentration saturated at about $10^{18}/cm^3$ after activation, as noted above; and (4) the implant profile was broadened. The dead surface layer is correlated with the heavily damaged surface associated with heavy ion implants (e.g., Mg, Zn). To eliminate the dead surface layer, an elevated temperature (hot) implant was proposed for Mg and Zn. However, a more graded implant tail was observed as the result of the hot implant, especially for a shallow p+-implant (Inada et al).

Regarding the in-diffusion of Be, Molnar et al conclude that most Be atoms in the diffusion front were in electrically inactive sites. They suggest, therefore, that in-diffusion is not a problem and furthermore that it can be eliminated by suitable RTA. However, our attempts to reproduce their experiments indicate the contrary: the in-diffusion was not eliminated by RTA and Be was located on electrically active sites. The mechanism for the Be in-diffusion is not clear, but theory suggests it may be related to stoichiometric disturbances or bulk impurity redistribution during implantation and/or annealing.

In contrast, in the GaAs art workers have tried to control in-diffusion of the dopant species and to enhance peak carrier concentration and activation efficiency by pre-implanting with As ions followed by implantation of acceptor ions such as Zn. See, for example, an article by D. E. Davies et al in *App. Phys. Lett.*, Vol. 44, No. 3, pp. 304–6 (1984). Despite these results, the only known attempt to apply co-implantation to In-based Group III-V compounds (As and Zn co-implantation into InGaAs) showed no increased peak carrier concentration or profile abruptness over the use of Zn implantation alone. See, E. V. K. Rao et al, *Jap. J. Appl. Phys.*, Vol. 25, No. 6, pp. L458–461 (June, 1986), especially FIG. 2(a) where the Zn-alone and Zn/As co-implant profiles are shown to be nearly identical.

SUMMARY OF THE INVENTION

In order to reduce in-diffusion and increase the peak carrier concentration and activation efficiency of Be ions implanted into In-based Group III-V compound semiconductors, in accordance with one aspect of the invention, the semiconductor is co-implanted; that is, the semiconductor is first implanted with a Group V species and then implanted with Be.

In a preferred embodiment InP or InGaAs is first implanted with either P or As ions and then implanted with Be ions. Following suitable rapid thermal annealing, the implanted semiconductors exhibit significantly reduced in-diffusion, 3 to 4 times higher peak carrier concentration and double the activation efficiency of Be-alone implantation. The resulting highly doped, shallow p$^+$-layers have been used to fabricate InP JFETs and InP/InGaAs APDs.

BRIEF DESCRIPTION OF THE DRAWING

The invention, together with its various features and advantages, can be readily understood from the following more detailed description taken in conjunction with accompanying drawings, in which.

DETAILED DESCRIPTION

Figure 1:
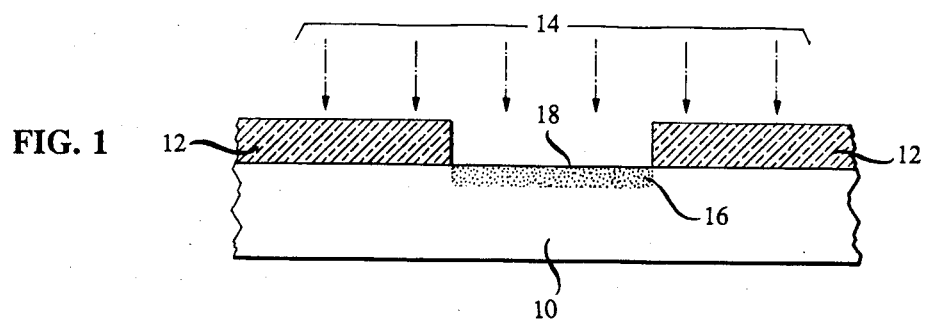
FIG. 1 is a cross-sectional view of a semiconductor body on which a mask has been formed to enable ion implantation into a localized zone of the body.

Turning now to FIG. 1, there is shown an In-based Group III-V compound semiconductor body 10 which may comprise, for example, an In-based Group III-V compound single crystal substrate or such a substrate with one or more epitaxial layers grown thereon. For FET applications the substrate is typically semi-insulating or, if not, it has a semi-insulating epitaxial layer on it. Typically a mask 12 (single layer or composite of several layers) is disposed between body 10 and a source (not shown) of ions 14 to be implanted into a localized zone 16 of body 10. The zone 16 is defined by an opening in the mask which exposes a portion 18 of a major surface of body 10. Since the thickness of mask 12 is chosen to prevent any substantial penetration of the ions therethrough, only zone 16 is implanted with ions. Alternatively, the mask 12 may be extended over surface portion 18 provided that it is made thin enough over portion 18 to permit ions to penetrate therethrough. Of course, where the entire major surface is to be implanted, the mask may be omitted altogether.

After the ions 14 are implanted into zone 16, the body 10 is subjected to a high temperature activation step which causes a significant fraction of the ions to become electrically active (i.e., to function as dopants). Subsequent processing steps enable the ion-implanted body 10 to be fabricated into a variety of devices such as JFETs and APDs which will be described later.

In accordance with one aspect of the invention, the body 10 is subjected to co-implantation of Be, a p-type dopant, and a Group V species; that is, the Group V species is implanted into zone 16 first followed by implantation of Be ions. A significant advantage of the invention is the reduction of in-diffusion of the implanted dopant species, thus enabling the fabrication of zones 16 which are thin and have relatively high carrier concentrations. In particular, the invention can be used to fabricate relatively shallow, abrupt p-n junctions. In addition, the invention produces carrier (hole) concentrations and activation efficiencies which exceed those obtained when Be ions alone are implanted.

In a preferred embodiment, the dose and energy of the implants should be chosen so that the atomic distributions of the implanted Group V species and Be are essentially coextensive. In addition, it is preferable that the Group V species be implanted while the semiconductor is heated to an elevated temperature whereas Be is implanted at room temperature.

The invention is applicable generally to In-based Group III-V compounds such as InP or InGaAs co-implanted with Be and with P or As.

The following examples describe experiments which demonstrate the efficacy of co-implantation. Unless otherwise stated, various materials, dimensions, operating conditions and other parameters are provided by way of illustration only and are not intended to limit the scope of the invention.

EXAMPLE I

This example describes the co-implantation of Be and P ions into an InP wafer. The wafer was Fe-doped, semi-insulating (100) InP grown by liquid encapsulation Czochralski (LEC) to have a resistivity of $\sim 10^8$ $\Omega$-cm. After being degreased with organic solvents and etched in a 10:1:1 $H_2SO_4$:$H_2O_2$:$H_2O$ solution, the wafer was first implanted with P ions at 200° C. with an energy of 100 keV and then implanted with Be ions at room temperature with an energy of 20 keV. Both P and Be doses were of the order of $10^{13}/cm^2$, e.g., $6 \times 10^{13}/cm^2$. Other energies and doses may be suitable depending on the specific application. The purpose of the elevated temperature P ion implant is to reduce the lattice damage introduced by a heavier P ion. The energy and dose were chosen so that the Be and P atomic distributions in the semiconductor were essentially coextensive (curves 1 and 2 of FIG. 2). The wafer was tilted by 7° from the <100> axis during implantation to avoid possible channeling. The implanted wafer was activated in the presence of a flow of forming gas using rapid thermal annealing (RTA) and was placed with the implanted side down on a GaAs cover wafer for proximity annealing. Temperature was measured by a thermocouple in a Si wafer holder on which the GaAs cover wafer was placed. Annealing temperatures ranged from 800° C.$\leq$T$\leq$900° C., whereas the annealing time ranged from 5$\leq$t$\leq$15 seconds; for example, t=15 seconds for T$\leq$850° C., and t=5 seconds for T=900° C. For comparison, reference wafers were ion implanted with Be ions only at 20 keV and a dose of $6 \times 10^{13}/cm^2$. The reference wafers were annealed at 800°–900° C. for 5 to 15 seconds.

The annealed wafers were electrically characterized using C-V measurements to determine the peak carrier (hole) concentration and van der Pauw Hall measurements to estimate the sheet resistivity as well as the sheet carrier concentration. Electrical carrier profiles were measured with an electrochemical profiler.

The peak carrier concentration for the reference wafers implanted with Be only ranged from 5.5 to $7 \times 10^{17}/cm^3$. Electrical activation was estimated to be about 20%. In contrast, with the co-implant of P and Be ions the peak carrier concentration ranged from 1.5 to $2 \times 10^{18}/cm^3$, a factor of about 3 to 4 times to higher than the reference wafer. In addition, the co-implanted wafer had an activation $\geqq 40\%$, more than double that of the reference wafer.

Figure 2:
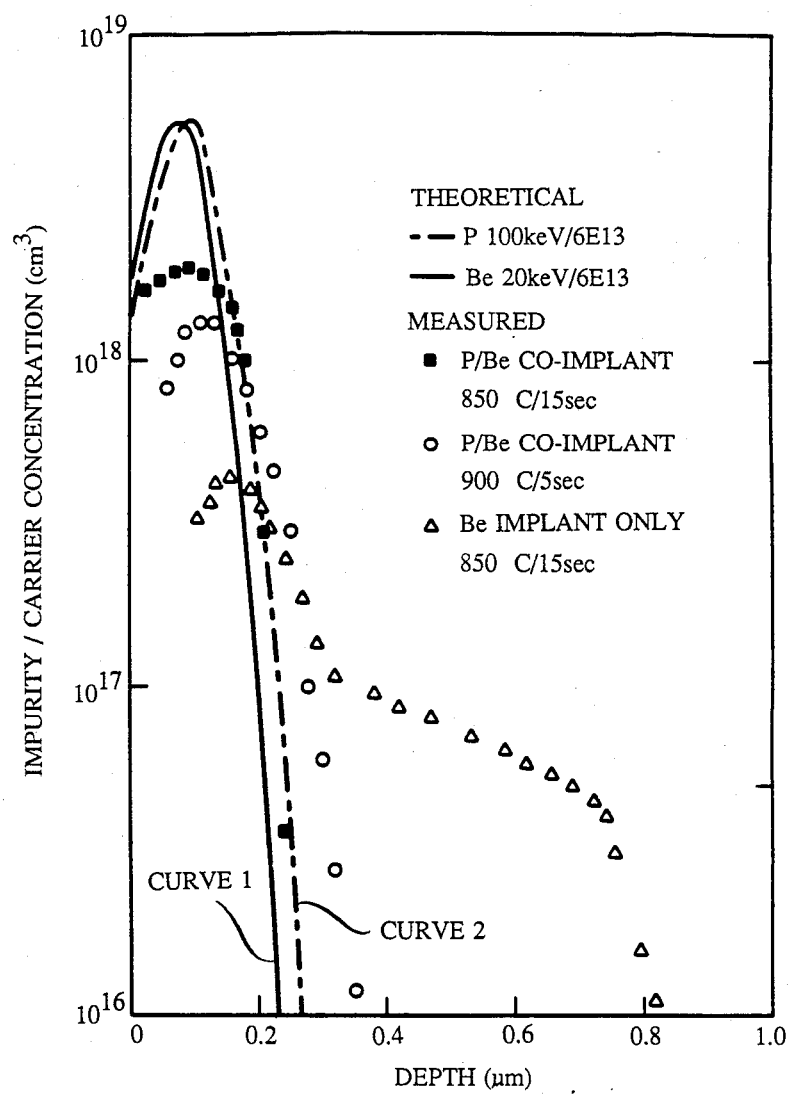
FIG. 2 shows electrical carrier concentration profiles comparing a Be-implanted wafer with a Be/P co-implanted wafer after annealing.

Electrical carrier profiles of the Be ion implanted reference wafer exhibited in-diffusion of Be at all temperatures. The triangular data points of FIG. 2 illustrate the in-diffusion; that is, the diffusion front extends to 0.8 $\mu$m as compared with the theoretically calculated original Be profile (curve 1) which extended to a depth of only about 0.22 $\mu$m.

In contrast, the carrier concentration profiles for P/Be ion co-implants at T=850° C. and 900° C. are shown by the rectangular and circular data points, respectively. The figure clearly shows that significant Be in-diffusion was essentially eliminated using pre-implantation of P ions, especially when annealed at 850° C. for 15 seconds. As a result, a 40% activation and a peak carrier concentration of $2 \times 10^{18}/cm^3$ were measured. These results are important because a shallow p+-layer results from the Be/P ion co-implant. Excellent control of the p+-layer thickness and the sharp implant tail enable device requirements to be met better than with only a Be ion implant. Room temperature P ion pre-implantation followed by room temperature Be ion implantation has also been tried. As above, Be in-diffusion was essentially eliminated, the profile having sharp cut-off in the implant tail region. The carrier concentration of $\sim 10^{18}/cm^3$ was slightly lower than that of the high temperature implant.

EXAMPLE II

The basic procedures of Example I were followed to co-implant As and Be ions into Fe-doped semi-insulating InP wafers. The As ions were implanted first at 200° C. and 180 keV followed by Be ion implantation at room temperatures and 20 keV. Both Be and As doses were of the order of $10^{13}/cm^2$, e.g., $6 \times 10^{13}/cm^2$. Other energies and doses may be suitable depending on the specific application. Essentially, no Be in-diffusion was observed after activation at 850° C. for 15 seconds. Shallow junctions ($\sim 2000$ Å) with high peak carrier concentrations ($\sim 2 \times 10^{18}/cm^3$) were obtained. Comparable results were obtained using room temperature As and Be implantations under conditions similar to those above.

EXAMPLE III

The basic procedures of Example I were followed to co-implant P and Be ions into InGaAs. The wafers comprised a (100) InP substrate on which two epitaxial layers were grown by metal-organic chemical vapor deposition (MOCVD): a 2 $\mu$m thick semi-insulating, Fe-doped InP layer followed by a 0.4 $\mu$m thick S-doped n-In $_{0.53}$Ga$_{0.47}$As layer (n~$7-8 \times 10^{16}/cm^3$). P ions were implanted first at 200° C., 100 keV and a dose of $6 \times 10^{13}/cm^2$. Be ions were implanted at room temperature in a non-channeling direction at 20 keV and a dose of $6 \times 10^{13}/cm^2$. As before, other energies and doses may be suitable. Two-step RTA was performed over a wide range of temperatures and times; e.g., 650°–800° C. for 1–15 seconds. An illustrative two-step anneal entailed a first anneal at 650° C. for 10 seconds followed by a second anneal at 780°–820° C. for 1–5 seconds.

Significantly reduced Be in-diffusion was observed and the hole concentration was in the range of about $3.5-4 \times 10^{18}/cm^3$. These implants produce a shallow p-n junction ($\sim 2000$ Å) and an estimated electrical activation >70%. By comparison, Be only implantation at the same energy and dose produced much lower peak carrier concentrations ranging from about $5 \times 10^{17}$ to $1 \times 10^{18}/cm^3$.

EXAMPLE IV

The basic procedures of Example III were followed to co-implant As and Be ions into InGaAs. The As ions were implanted at 200° C., 180 keV and a dose of $6 \times 10^{13}/cm^2$, and Be ions were implanted at room temperature at 20 keV and a dose of $6 \times 10^{13}/cm^2$. As before, other energies and doses may be suitable. Again, there was essentially no Be redistribution after two-step annealing. When annealed at 650° C. for 10 seconds followed by 780° C. for 3 seconds, the shallow p-n junction was located at about 2000 Å under the InGaAs surface and the peak carrier concentration was $4.3 \times 10^{18}/cm^3$. Similarly, annealing at 650° C. for 10 seconds followed by 800° C. for 5 seconds produced a junction at about 1700 Å and a peak carrier concentration of about $3.5 \times 10^{18}/cm^3$. In both cases, the activation efficiency was estimated to be about 60%.

EXAMPLE V

Figure 3:
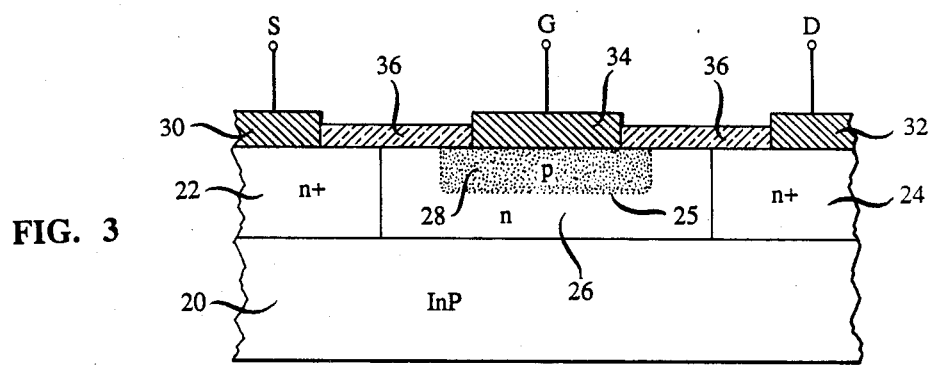
FIG. 3 is a cross-sectional view of a planar JFET fabricated in accordance with one embodiment of the invention.

This example describes the fabrication of a depletion mode JFET shown schematically in FIG. 3. The device comprised a (100) Fe-doped, LEC semi-insulating InP substrate into which n+-type source and drain regions 22 and 24 and an n-type channel region 26 were formed by Si-ion implantation (all implants at 240 keV energy, but at a dose of $4 \times 10^{12}/cm^2$ for the channel region and a dose of $5 \times 10^{13}/cm^2$ for the source and drain regions). A shallow, abrupt p-n junction 25 was formed in the channel region 26 by Be/As ion co-implantation in accordance with an illustrative embodiment of the invention (180 keV As at 200° C. and $6 \times 10^{13}/cm^2$ followed by 20 keV Be at room temperature and $6 \times 10^{13}/cm^2$). A silicon nitride layer was used as an implant mask, and RTA with an Al$_2$O$_3$ cap was used to activate the implanted species. Source, drain and gate electrodes 30, 32 and 34, respectively, were deposited using well known metalization techniques and were alloyed using RTA. Likewise, a dielectric passivation layer 36 was deposited by means well-known in the art to cover the exposed p-n junction.

The channel region n+ implant (region 26) was 4000 Å deep and the gate was 2 $\mu$m long. A transconductance of 50 mS/mm and an output impedance of 400 ohm-mm were measured at a gate bias voltage of zero with a gate capacitance of 1.2 pF/mm. These data translate into a cut-off frequency of 6.6 GHz and an inverter gain of 20. The JFET had a threshold voltage of $-2.4$ V and a saturated drain current of 650 mA/mm at zero gate-to-source voltage with negligible drift.

The device can also be operated in an enhancement mode by making the channel thickness smaller and altering the bias conditions as is well known in the FET art.

EXAMPLE VI

Figure 4:
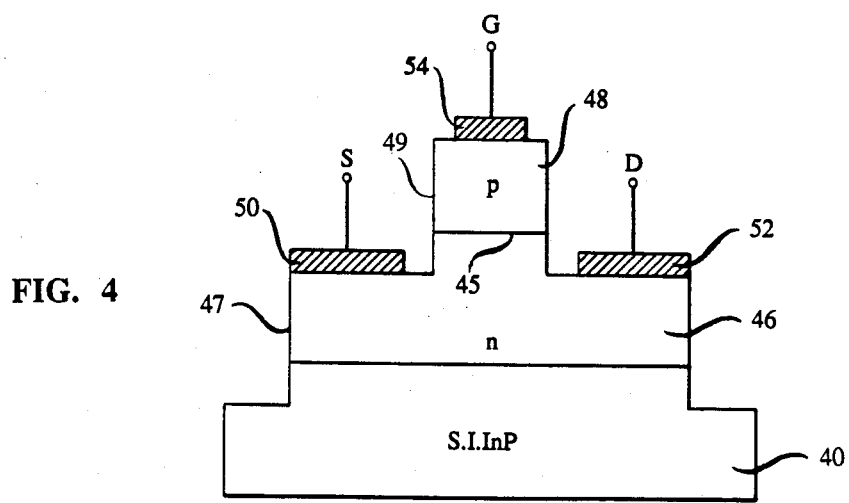
FIG. 4 is a cross-sectional view of a mesa JFET fabricated in accordance with another embodiment of the invention.

This example describes the fabrication of a mesa geometry JFET shown schematically in FIG. 4. The JFET comprised a (100) Fe-doped, LEC semi-insulating InP substrate 40 in which a n-type channel region 46 was formed by room temperature Si ion implantation (300 keV at a dose of $4\times10^{12}/cm^2$) and a shallow, abrupt p-n junction 45 was formed by Be/P ion co-implantation (100 keV P at 200° C. and a dose of $6\times10^{13}/cm^2$ followed by 20 keV Be at room temperature and a dose of $6\times10^{13}/cm^2$) into the n-type region. The implanted species were activated using RTA at 850° C. for 15 seconds.

The p-n junction 45 was about 2000 Å from the top surface of the implanted p-type region which had a hole concentration of about $10^{18}/cm^3$. The electron concentration in the channel was about $6-7\times10^{16}/cm^3$. The gate measured 5 $\mu m \times 80$ $\mu m$.

After ion implantation and activation, gate electrodes 54 were deposited and individual devices were isolated by etching to form the outer mesa 47 which extended down to substrate 40. A well-known air bridge (not shown) was formed between a gate pad (not shown) and the JFET to reduce parasitic capacitance. The gate region 48 was then photolithographically defined and 2400 Å of material was etched away to expose the n-type region and to form the central mesa 49 which extended through the junction 45. Source and drain electrodes 50 and 52, respectively, were then deposited and annealed.

The JFET can be operated in either a depletion mode or an enhancement mode.

Excellent device characteristics were obtained: an effective channel mobility of 2000 cm²/V second, a transconductance as high as 50 mS/mm, and a cut-off frequency 2 GHz. Even better device performance is expected by decreasing the gate length and/or by optimizing the ion-implantation activation.

EXAMPLE VII

Using the co-implantation conditions for P and Be as described in EXAMPLE III, a mesa geometry JFET was fabricated in InGaAs as follows. A semi-insulating Fe-doped InP layer was epitaxially grown on an n-InP substrate by metal-organic chemical vapor deposition (MOCVD) and a 5000 Å thick n-InGaAs (S-doped to $1\times10^{17}/cm^3$) was grown by the same process on the semi-insulating layer. Standard photolithographic and etching techniques were used to form a self-aligned gate in the shape of an InGaAs mesa about 2500 Å high. The p-n junction was located about 2000 Å deep in the mesa and was formed by co-implantation of P and Be.

After standard metalization, the device was operated in a depletion mode and its characteristics were measured. The JFET had a transconductance of about 250 mS/mm. Theory indicates a cut-off frequency of about 50 GHz.

EXAMPLE VIII

This example describes the fabrication of an avalanche photodiode (APD) of the type known as separate absorption and multiplication (SAM). The absorption region comprised n-InGaAs which was grown on an n-InP body (e.g., substrate plus buffer layer). The multiplication region comprised an n-InP layer on the InGaAs with a p-n junction formed in a zone of the n-InP by co-implantation of As and Be ions into that zone. In particular, As and Be ions were co-implanted (180 keV As at 200° C. and a dose of $1\times10^{13}/cm^2$ and 20 keV Be at room temperature and a dose of $6\times10^{13}/cm^2$) to form a 100 $\mu m$ diameter circular zone which extended about 2000 Å into the n-InP layer, thus forming the basis for the main photocurrent-collecting p-n junction of the APD. The design included means for increasing the breakdown voltage of the edge of the junction at the InP surface. The peak hole concentration in the implanted zone was about $2-3\times10^{18}/cm^3$. Light at 1.3 $\mu m$ was transmitted through the n-InP and absorbed in the InGaAs to generate a photocurrent. When operated at about 46.5 V reverse bias, the APD had a gain of 20. The breakdown voltage was greater than 70 V.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the p⁺-layer attained by co-implantation can function as a contact-facilitating layer of the type used for making ohmic contact to devices such as semiconductor lasers.

What is claimed is:

1. A method of manufacturing a semiconductor device comprising:
    providing an In-based Group III–V compound semiconductor body,
    implanting ions in a region of said body, and
    annealing said body to render said species electrically active, characterized in that said implanting step includes
    first implanting into said region Group V ions, followed by second implanting into said region Be ions.

2. The method of claim 1 wherein said compound is selected from the group consisting of InP and InGaAs.

3. The method of claim 2 wherein said Group V ions are selected from the group consisting of As and P.

4. The method of claim 3 wherein said body comprises InP and is annealed by a rapid thermal annealing process at a temperature ranging from about 800° to 900° C. for a time of about 5 to 15 seconds.

5. The method of claim 3 wherein said body comprises InGaAs and is annealed by a two-step rapid thermal annealing process, first at a lower temperature and longer time and second at a higher temperature and shorter time, in the range of 650° to 820° C. and 1 to 10 seconds.

6. The method of claims 4 or 5 wherein said ions are implanted at a dose of the order of $10^{13}/cm^2$.

7. The method of claim 3 wherein said first implanting step is performed at an elevated temperature.

8. The method of claim 7 wherein said second implanting step is performed at room temperature.

9. The method of claims 1, 2, 3, 4, 5, 7 or 8 wherein said first and second implanting steps produce distributions of said Group V and Be ions which are essentially coextensive.

10. The method of claims 1, 2, 3, 4, 5, 7 or 8 wherein said implanting steps produce a p-n junction in said body.

11. The method of claim 10 wherein said junction is incorporated in a field effect transistor.

12. The method of claim 10 wherein said junction is incorporated in an avalanche photodiode.

13. A method of manufacturing a semiconductor device comprising:
    providing an In-based Group III–V compound semiconductor body having an n-type region, first implanting into said region at an elevated temperature a Group V ion species selected from the group consisting of As and P, second implanting Be ions into said region at essentially room temperature so that the distributions of Group V ions and Be ions are essentially coextensive, and rendering the ions electrically active so as to form a relatively abrupt p-n junction in said region.

14. The method of claim 13 wherein said junction is incorporated in a field effect transistor.

15. The method of claim 13 wherein said junction is incorporated in an avalanche photodiode.

16. The method of claim 13 wherein said rendering step includes rapid thermal annealing at a temperature in the range of 650°–820° C. for time in the range of 1–15 seconds.

* * * * *